United States Patent [19]

Brower

[11] 4,382,774
[45] May 10, 1983

[54] SPARK GAP SWITCH

[75] Inventor: Boyd G. Brower, Williamsport, Pa.

[73] Assignee: GTE Products Corporation, Stamford, Conn.

[21] Appl. No.: 261,354

[22] Filed: May 7, 1981

[51] Int. Cl.³ .............................................. F21K 5/02
[52] U.S. Cl. .................................. 431/359; 252/501.1; 337/413; 362/6; 362/11; 362/15; 315/323
[58] Field of Search ....................... 431/357, 359, 365; 102/202.8, 202.9; 337/413; 362/11, 13, 15, 4, 6; 315/66, 69, 323; 361/249; 252/501.1; 200/61.02

[56] References Cited

U.S. PATENT DOCUMENTS

| | | | |
|---|---|---|---|
| 3,738,791 | 6/1973 | Cressman | 431/359 |
| 3,742,298 | 6/1973 | Cote | 431/359 X |
| 3,951,582 | 4/1976 | Holub et al. | 362/13 X |
| 4,182,607 | 1/1980 | Collins et al. | 431/359 |
| 4,182,608 | 1/1980 | Chevali et al. | 431/359 |
| 4,330,821 | 5/1982 | Brower et al. | 431/359 X |
| 4,334,856 | 6/1982 | Broadt et al. | 431/359 |
| 4,336,570 | 6/1982 | Brower et al. | 431/359 X |
| 4,345,895 | 8/1982 | LeFever et al. | 431/359 |

Primary Examiner—Samuel Scott
Assistant Examiner—Margaret A. Focarino
Attorney, Agent, or Firm—Thomas H. Buffton

[57] ABSTRACT

A flashlamp unit for individual and sequential firing of flashlamps includes a pair of flashlamps connected in an electrical circuit with a radiation-responsive N/O arc gap switch in series connection with one of said pair of flashlamps and including an arc gap having a radiation-responsive material thereover and therebetween.

8 Claims, 3 Drawing Figures

SPARK GAP SWITCH

TECHNICAL FIELD

This invention relates to switches for multilamp photoflash arrays and more particularly to a normally open (N/O) switch for a sequentially activated multilamp photoflash unit.

BACKGROUND ART

Generally, photoflash units may be classified as either a low voltage or a high voltage unit. The low voltage photoflash units usually employ a battery or a charged capacitor whereby a voltage in the range of about 1.5 to 15.0 volts is provided. The high voltage photoflash units ordinarily employ a piezoelectric element and provide a pulse voltage in the range of about 2000 to 3000 volts.

Also, it is a common practice to employ sequencing circuitry wherein a plurality of photolamps are sequentially activated by a voltage from either a low or high voltage source. Moreover, this sequential activation of the photolamps is usually controlled by a plurality of radiation switches connected on circuit with the photolamps and the voltage source.

The radiation switches may be either of the normally closed type or the normally open (N/O) variety, and the normally open switch appears to be the more common. As is known, the N/O type radiation switch is positionally located adjacent a photolamp and has a relatively high resistance prior to radiation impingement. However, activation of the nearby photolamp serves to provide the necessary radiation whereupon the radiation-responsive switch is converted from a high resistance or open circuit condition to a relatively low resistance substantially short circuit condition.

Ordinarily, the N/O radiation-responsive switches include a pair of terminals spaced about 0.04" to 0.08" apart and covered over with an insulating material which becomes electrically conductive upon exposure to radiant energy from a nearby lamp. Examples of such radiation-responsive switches and materials are provided in U.S. Pat. Nos. 3,969,065 and 3,951,582 wherein copper and silver salts are employed with a plurality of different combustible binders.

Silver salts are currently used in most of the radiation-responsive switches employed in sequentially operable multilamp photoflash arrays. However, the silver used in such switches must have a relatively high level of chemical purity which adds greatly to the already relatively high cost of silver salts. Moreover, the silver salts have a relatively limited range of activation as compared with a photolamp which has a temperature range which is both wider and less controllable than the activation range of the N/O switch. As a result, it has been found that a switch sensitive enough to be activated by a low temperature lamp will exhibit "burn off" or inactivation when energized by a high temperature lamp. On the other hand, a switch insensitive enough to resist "burn off" by a high temperature lamp will not be activated by a low temperature lamp whereupon an open circuit will result.

At present, it is a common practice to design a N/O radiation-responsive switch such that exposure to a low temperature lamp is sufficient to activate the switch. The problem of "burn off" due to an excess of radiant energy is compensated for by making the N/O switch larger than the activating aperture of a reflector as illustrated in FIG. 1. In this manner a switch activation gradient is provided between a completely vaporized area 5 and a completely inactivated area 7. However, a relatively large switch area tends to introduce problems of cracking during the switch drying process and, if the cracks are large enough, results in an undesired lamp failure. Moreover, a relatively large switch is undesirably expensive of materials.

Additionally, it is known that arc gaps may be used in a sequential photolamp array as evidenced by U.S. Pat. No. 3,742,298. However, the above-described structure is dependent upon the breakdown of the arc gap whereupon conduction across the arc gap is achieved.

SUMMARY OF THE INVENTION

An object of the present invention is to provide an enhanced flashlamp unit. Another object of the invention is to improve the operational capabilities of a sequentially operable multilamp photoflash unit. Still another object of the invention is to provide an enhanced radiation-responsive switch for a flashlamp unit. A further object of the invention is to provide a sequentially operable multilamp photoflash unit with an improved radiation-responsive switch which includes a spark gap capability.

These and other objects, advantages and capabilities are achieved in one aspect of the invention by a flashlamp unit having at least a pair of flashlamps with a radiation-responsive switch in series connection with one flashlamp and adjacent the other flashlamp and the radiation-responsive switch having an arc gap with a radiation-responsive material thereover and therebetween the arc gap whereby radiation from a flashlamp renders the radiation-responsive switch conductive.

In another aspect of the invention the radiation-responsive material of the switch may be of the type which is rendered conductive in response to radiation and thus provides not only an electrical conductive path by way of the radiation-responsive material but also by way of the arc gap. Alternatively, the radiation-responsive material may be of a readily vaporized material such that the radiation from a flashlamp evaporates the non-conductive material and an electrical path is provided by the arc gap.

BEST MODE FOR CARRYING OUT THE INVENTION

For a better understanding of the present invention, together with other and further objects, advantages and capabilities thereof, reference is made to the following disclosure and appended claims in connection with the accompanying drawings.

Figure 1:
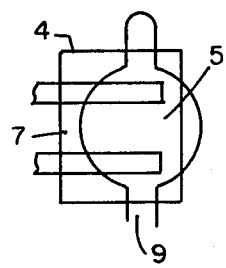
FIG. 1 illustrates a prior art radiation-responsive switch arrangement.

Referring to the drawings, FIG. 1 diagrammatically illustrates a radiation-responsive switch of the prior art. Therein, a radiation responsive material 4 includes a vaporized area 5 wherefrom the radiation-responsive material may be completely removed whenever an adjacent flashlamp provides an excess of radiation. Also an inactivated area 7 provided by the shielding adjacent a limited aperture 9 provides a conductive path should the excessive radiation render the vaporized area 5 non-conductive. However, It has been found that severe cracks sometimes develop in the inactivated area 7 during switch fabrication. Moreover, these undesired cracks, if severe enough, prohibit development of a conductive path by way of the inactivated area 7 and also prohibit conversion of the switch from a non-conductive to a conductive state. Also, the material required to provide both a vaporizable area 5 and an inactivated area 7 is both excessive and expensive.

Figure 2:
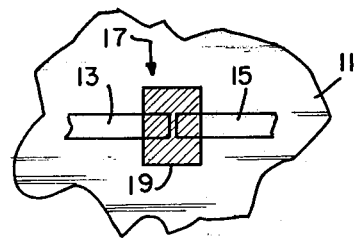
FIG. 2 is a diagrammatic illustration of a radiation-responsive switch arrangement of the invention.

Referring to FIG. 2, a printed circuit board 11 has affixed thereto a radiation-responsive spark gap switch. This radiation-responsive spark gap switch includes a first and second electrical conductor 13 and 15 affixed to the printed circuit board 11 and having an arc gap 17 therebetween. A radiation-responsive material 19 is positionally located over a portion of the electrical conductors 11 and 13 forming the arc gap 17 as well as within the arc gap 17.

Normally, the radiation-responsive material 19 is in an electrically non-conductive state until exposed to radiation, usually from a nearby flashlamp. Thereupon, the electrically non-conductive radiation-responsive material 19 is converted to an electrically conductive state. Thus, there is provided a radiation-responsive arc gap switch wherein the radiation-responsive material 19 provides an electrically conductive path and the arc gap 17 also provides a path for electrical conduction when a relatively high potential source is utilized.

Alternatively, the radiation-responsive material 19 may be substantially removed or "burned off" by excessive radiation from a nearby flashlamp. However, removal of the radiation-responsive material 19 does not negate the effects of the radiation-responsive switch since the arc gap 17 provides a path for electrical conduction and conversion of the switch from a non-conductive to a conductive state.

As to materials, a preferred radiation-responsive material 19 for an arc gap switch includes silver coated glass spheres in a binder such as polystyrene, for example. Such a material is not only converted to a conductive material in responsive to radiation from a nearby photolamp but also utilizes the silver coated spheres to reduce the arc gap 17 intermediate the electrical conductors 11 and 13. Thus, the potential necessary to overcome the arc gap 17 and provide a conductive path is reduced while the reliability of the conversion of the switch from a non-conductive to a conductive state is enhanced. Preferably arc gap 17 has a spacing in the range of about 0.005 to 0.015 inch and is converted from a voltage breakdown level of about 2000 to 3000-volts to a level of about 300 to 400-volts by radiation from a nearby flashlamp.

Alternatively, an easily vaporizable radiation-responsive material 19, such as acrylic, waxes, or organic polymers is suitable for a radiation-responsive arc gap switch. As mentioned before, radiation from a nearby photolamp "burns off" the easily vaporizable material whereupon the arc gap 17 provides the electrical path whereby a subsequent photolamp is energized.

Figure 3:
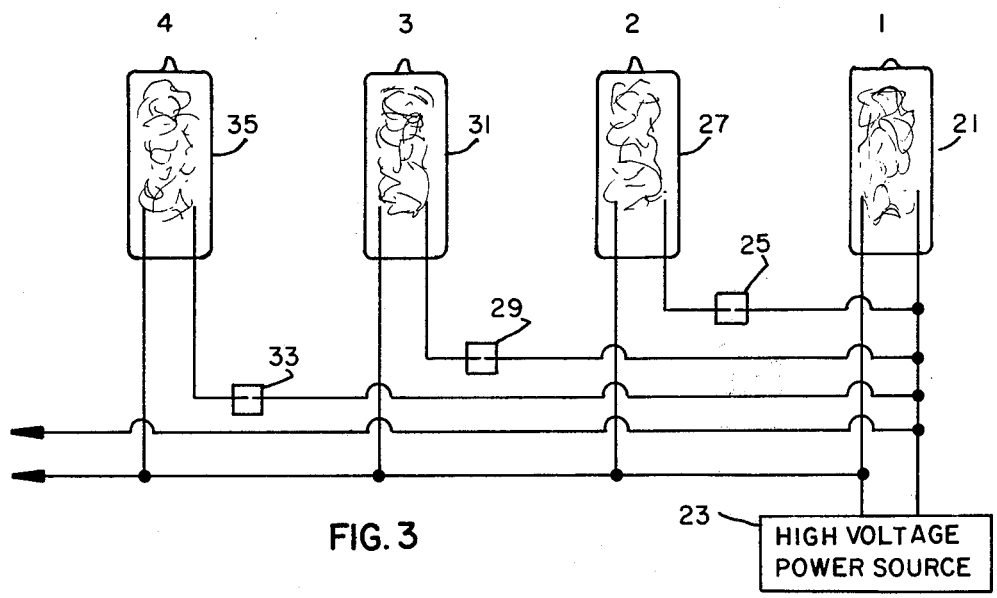
FIG. 3 is a diagrammatic illustration of a sequentially operable multilamp photoflash array.

As to the sequential operation of a multilamp array, reference is made to the diagrammatic illustration of FIG. 3. Therein, a first flashlamp 21 is directly connected to a high voltage source 23. A first radiation-responsive arc gap switch 25 is positionally located adjacent the first flashlamp 21 and in series connection with a second flashlamp 27. Also, a second radiation-responsive arc gap switch 29 is located adjacent the second flashlamp 27 and in series connection with a third flashlamp 31. Similarly, a third radiation-responsive arc gap switch 33 is adjacent the third flashlamp 31 and in series connection with a fourth flashlamp 35. Moreover, the series connected flashlamps and radiation-responsive switches may be continued so long as such sequential operation is desired.

In operation, a high voltage pulse from the high voltage power source 23 activates the first flashlamp 21 which, in turn, provides radiation in an amount sufficient to convert the first radiation-responsive arc gap switch 25 from a non-conductive to a conductive state. A second high voltage pulse is transmitted via the first arc gap switch 25 to the second flashlamp 27 to effect energization thereof. The energized second flashlamp 27 provides radiation which impinges the second radiation-responsive arc gap switch 29 and converts the switch to a conductive state. Moreover, the procedure is repeated for each series connected switch and flashlamp. Thus, the flashlamps are sequentially activated in conjunction with the conversion of the individual radiation-responsive arc gap switches.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

Thus, there has been provided a unique flashlamp unit suitable for use with a relatively high voltage potential source. The flashlamp unit includes a radiation-responsive arc gap switch having an arc gap covered with a radiation-responsive material. The radiation-responsive material, in response to energization by an activated flashlamp, is converted from a non-conductive to a conductive state to provide a first electrical path by way of the radiation-responsive material and a second electrical path via the arc gap from a potential source to a following flashlamp. Thus, sequential operation of the flashlamps is effected.

In another aspect of the invention, the switch remains workable even though an excess of radiation is present. In such cases, the excess radiation tends to "burn away" the radiation-responsive material. However, removal of the radiation-responsive material still leaves the arc-gap and an electrically conductive path from a voltage source to a following flashlamp. Again, sequential operation of the flashlamps is effected.

I claim:
1. A flashlamp unit comprising:
   a pair of high voltage flashlamps connected to an electrical circuit and arranged to fire individually and in sequence;
   a radiation-responsive N/O switch connected into said electrical circuit in series connection with one and external from and adjacent the other one of said pair of flashlamps and positioned for radiation impingement from said one of said flashlamps, said flashlamp unit characterized by the improvement wherein said radiation-responsive switch is in the form of an arc gap having a radiation-responsive material thereon and therebetween said gap with radiation from said one flashlamp converting the radiation-responsive material and arc gap combina- tion from an electrically non-conductive to an electrically conductive state.

2. The flashlamp unit of claim 1 wherein said radiation from said flashlamp converts said radiation-responsive material from an electrically non-conductive to an electrically conductive state to provide an electrically conductive path shunting said arc gap.

3. The flashlamp unit of claim 1 wherein said radiation from said flashlamp causes removal of said radiation-responsive material therebetween said spark gap to provide a spark gap switch having an electrically conductive path for energization of said other flashlamp.

4. The flashlamp unit of claim 1 wherein said arc gap has a gap in the range of about 0.005" to 0.015" and said radiation-responsive switch is converted from a voltage breakdown level of about 2000 to 3000 volts to a level of about 300 to 400 volts by radiation from said flashlamp.

5. In a self-sequencing multilamp array having a printed circuit board connected to a high voltage potential source coupled to a first flashlamp and to a plurality of series connected radiation-responsive switches and flashlamps with each of said radiation-responsive switches positionally located adjacent a previously energizable flashlamp, said array characterized by the improvement wherein each one of said radiation-responsive switches includes the combination of an arc gap and a radiation-responsive material thereof and therebetween said arc gap whereby radiation from a flashlamp converts an adjacent radiation-responsive material and arc gap combination from an electrically non-conductive to an electrically conductive state.

6. The self-sequencing multilamp array of claim 5 wherein said switch includes an arc gap and a radiation-responsive material combination and said radiation-responsive material is removed in response to radiation from a nearby flashlamp whereby said arc gap serves as an electrically conductive path of said radiation-responsive switch.

7. The self-sequencing multilamp array of claim 5 wherein said radiation-responsive switch is converted from a voltage breakdown level of about 2000 to 3000 volts to a voltage conductive path in response to radiation from a flashlamp.

8. The self-sequencing multilamp array of claim 5 wherein said radiation-responsive switch includes a radiation-responsive material converted to an electrical conductive path shunting said arc gap in response to radiation from said flashlamp.

* * * * *